United States Patent [19]
Beneking

[11] Patent Number: 4,466,008
[45] Date of Patent: Aug. 14, 1984

[54] FIELD EFFECT TRANSISTOR

[76] Inventor: Heinz Beneking, Rolandstrasse 1, D-5100 Aachen, Fed. Rep. of Germany

[21] Appl. No.: 312,811

[22] Filed: Oct. 19, 1981

[30] Foreign Application Priority Data

Oct. 30, 1980 [DE] Fed. Rep. of Germany ....... 3040873

[51] Int. Cl.³ ...................... H01L 29/80; H01L 29/48
[52] U.S. Cl. ......................................... 357/22; 357/15
[58] Field of Search ................... 357/22 V, 22 S, 22, 357/15

[56] References Cited

U.S. PATENT DOCUMENTS

| 3,569,801 | 3/1971 | Giaever . | |
|---|---|---|---|
| 3,761,785 | 9/1973 | Pruniaux . | |
| 3,823,352 | 7/1974 | Pruniaux et al. | 357/22 |
| 4,015,278 | 3/1977 | Fukuta et al. . | |
| 4,126,881 | 11/1978 | Von Basse et al. | 357/22 |
| 4,163,988 | 8/1979 | Yeh et al. | 357/22 |

FOREIGN PATENT DOCUMENTS

| 2263091 | 12/1972 | Fed. Rep. of Germany . | |
|---|---|---|---|
| 2321797 | 4/1973 | Fed. Rep. of Germany . | |
| 2543654 | 3/1977 | Fed. Rep. of Germany . | |
| 55-24433 | 2/1980 | Japan | 357/23 VD |
| 55-120168 | 9/1980 | Japan | 357/22 |

Primary Examiner—Martin H. Edlow
Assistant Examiner—Jerome Jackson, Jr.
Attorney, Agent, or Firm—Spencer & Frank

[57] ABSTRACT

A field effect transistor having a source and drain region arranged vertically in a semi-conductor body with an insulating layer separating them, a rectifying metal/semiconductor contact on a side surface of the semiconductor body to form a gate electrode, and a thin conductive layer arranged on the side surface to bridge the insulating layer at least in the region beneath the gate electrode.

13 Claims, 2 Drawing Figures

FIELD EFFECT TRANSISTOR

BACKGROUND OF THE INVENTION

The invention relates to a field effect transistor comprising a vertical arrangement of the source, gate and drain in which the gate electrode comprises a rectifying metal/semiconductor contact and is applied to a side or edge surface of the semiconductor body or to the channel in a depression in the semiconductor body between the source and the drain. Such an arrangement is known from U.S. Pat. No. 3,761,785. The channel is formed in this known arrangement by a conducting semiconductor layer between a drain and a source region. This channel region extends over the entire cross section of the drain region and the inclined side surface of the channel region is provided with a Schottky gate contact.

SUMMARY OF THE INVENTION

It is an object of the invention to provide a very sensitive vertical transistor which may be manufactured simply from a technological stand point and in which the basic structure is suitable for implementing self-conducting and self-blocking field effect transistors.

According to a first aspect of the invention, there is provided a field effect transistor comprising a semiconductor body, a source region and a drain region arranged vertically in said semiconductor body, an insulating layer separating said source region from said drain region, a rectifying metal/semiconductor contact forming a gate electrode and arranged on a side surface of said semiconductor body and a thin conductive layer at said side surface and bridging said insulating layer at least in the region beneath said gate electrode.

According to a second aspect of the invention, there is provided a field effect transistor comprising a vertical arrangement of the source, gate and drain, in which the gate electrode comprises a rectifying metal/semiconductor contact and is applied to a side surface of the semiconductor body or to the channel in a depression in the semiconductor body between the source and the drain, wherein said source and said drain are separated from each other by an insulating layer and said insulating layer is bridged at said side surface by a thin conductive layer at least in the region beneath the gate connection.

BRIEF DESCRIPTION OF DRAWINGS

The invention will now be described in greater detail, by way of example, with reference to the drawings, in which.

DESCRIPTION OF THE PREFERRED EMBODIMENTS

The invention that in a field effect transistor of the type described at the outset, the source and the drain be separated from each other by means of an insulating layer and this insulating layer be bridged at its edge with a thin conductive layer, at least in the region beneath the gate connection.

The thin conductive layer, which is preferably a semiconductor layer, forms the controllable channel and may be produced epitaxially, by means of diffusion or by ion implantation. By selecting the doping and thickness of this layer, field effect transistors may be produced which are either conductive or self-blocking when there is no gate voltage.

The insulating layer between the drain and the source region can be produced very easily by means of ion implantation. The ion implantation can be effected so that the semiconductor material is insulating at a certain depth beneath the semiconductor surface, whereas the surface region remains conductive and therefore is able to form the source or drain region.

Figure 1:
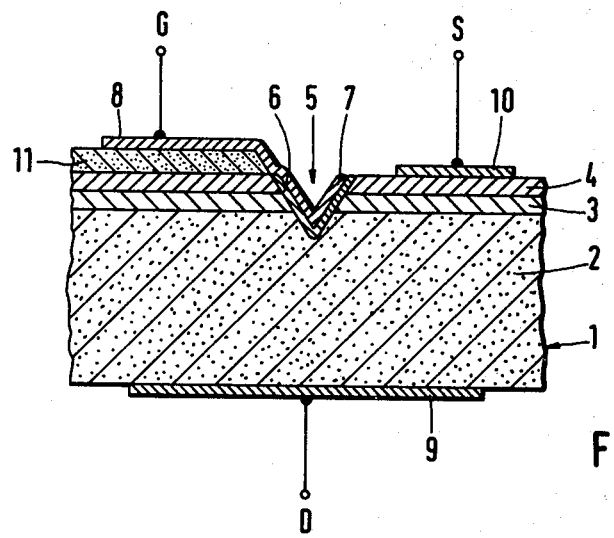
FIG. 1 shows a vertical field effect transistor in section with a V-shaped cut away portion in the semiconductor surface, and FIG. 2 also shows a field effect transistor according to the invention in section with a mesa-type elevation comprising semiconductor material on the surface of the semiconductor body.

Referring now to the drawings, in FIG. 1 a semiconductor body 1 is shown which comprises gallium arsenide or silicon, for example, and the substrate 2 of which forms the drain region in this embodiment. This drain region 2 has a doping of $10^{18}$ atoms/cm$^3$ by way of example and is therefore relatively low in resistance. An insulating layer 3, which may be produced by ion implantation, is located in the semiconductor body beneath a thin conducting surface region of the type of conductivity of the drain region, this surface region forming the source region 4. The insulating layer 3, which is approximately 0.1 to 0.3 μm thick, is formed at 300 kV by implantation of oxygen ions at a depth of 0.3 to 0.5 μm beneath the semiconductor surface. The source region 4 which remains at the surface of the semiconductor is therefore approximately 0.3 μm thick and has a doping of approximately $10^{18}$ atoms/cm$^3$.

A V-shaped depression 5 formed in a major surface of the semiconductor body 1, preferably by etching, penetrates the source region 1 and the insulating layer 3 and extends into the drain region 2. The V-shaped depression 5 may penetrate one μm deep into the semiconductor body. At least the surface of the V-shaped depression 5 is provided with a thin conductive layer 6 which forms the channel and may extend to the source region 4. This thin conductive layer, which is preferably a semiconductor layer and has the type of conductivity of the source and drain regions, is produced by diffusion, implantation or epitaxy. In order to implement a self-blocking transistor which does not permit any flow of current between the source and the drain when there is no gate potential, the layer 6 may be 0.1 μm thick and may have an impurity concentration of $10^{16}$ atoms/cm$^3$. On the other hand, in order to produce a self-conducting field effect transistor in which current flow between the source and the drain is possible when there is no gate potential, the layer 6 may be selected to be approximately 0.2 μm thick and may be provided with a doping of $10^{17}$ atoms/cm$^3$.

Finally, an oxide layer 11 is applied at least to one part of the semiconductor surface and therefore to the source region 4. This oxide layer 11 serves to reduce the parasitic capacitance and therefore may be relatively thick. The layer 11 comprises silicon dioxide for example and is 1 to 2 μm thick. Instead of silicon dioxide, layers of silicon nitride or aluminium oxide can be selected and these layers are particularly suitable for transistor structures comprising gallium arsenide.

A metallic Schottky gate electrode 7 is applied to the conductive semiconductor 6, by vapour deposition for example, and extends at least inside the groove 5 over the conductive layer 6 and preferably ends on the thick insulating layer 11 for the purpose of forming a gate terminal contact 8. Accordingly, the source region 4 is provided at an exposed part of its surface with a terminal contact 10 and the drain region 2 is provided on the rear face of the semiconductor with the terminal contact 9.

Figure 2:
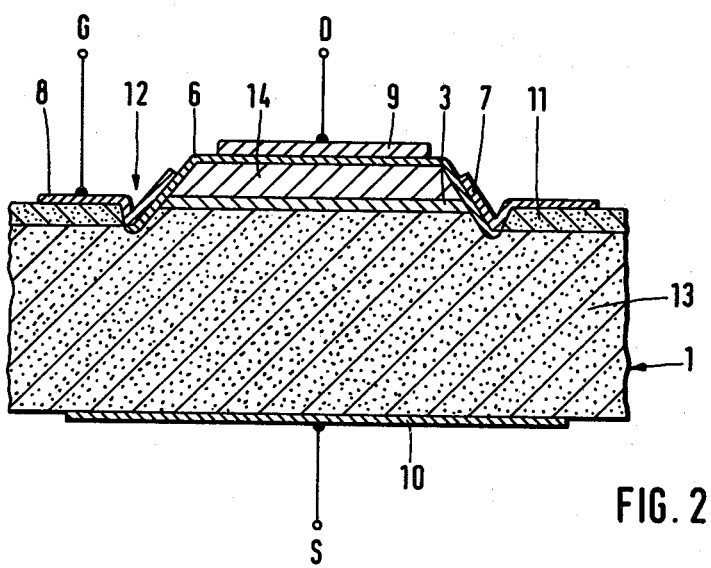

According to FIG. 2 a semiconductor body 1 comprising gallium arsenide or silicon is also provided, its substrate 13 preferably forming the source region in this case. The semiconductor body is initially subjected to an etching process with the aid of the known planar masking technology in order to produce a mesa-type elevation 12 comprising semiconductor material on the semiconductor surface. Alternatively, this mesa-type elevation may be manufactured by selective epitaxy. The semiconductor surface, with the exception of the mesa elevation, is provided with a relatively thick insulating layer 11, which insulating layer 11 preferably comprises silicon dioxide, silicon nitride or aluminium oxide and has a thickness of approximately 1–2 $\mu$m, for reducing the parasitic capacitance. Thereafter, as has already been described by way of FIG. 1, an insulating layer 3 is introduced into the 1–2 $\mu$m high mesa elevation, preferably by means of ion implantation, and the implantation process is in turn controlled so that a conductive region 14, forming the drain region in this case, remains at the semiconductor surface.

Then, a thin conductive layer 6 is produced at the edge surface of the mesa elevation, and if necessary on the mesa elevation itself, and this layer 6 is 0.1 to 0.2 $\mu$m thick and has an impurity concentration of between $10^{16}$ and $10^{17}$ atoms/cm$^3$, the width thickness and doping thereof depending on whether a self-blocking or self-conducting field effect transistor is to be produced. A metal contact 7 which forms a Schottky contact with the semiconductor layer 6 is applied to the thin conductive layer 6, which is preferably a semiconductor layer of the type of conductivity of the source and drain regions and was produced by diffusion, epitaxy or ion implantation, in the region of the edge surface of the mesa elevation. This metal contact 7, which comprises aluminium by way of example in the case of a GaAs semiconductor body, preferably extends on to the thick insulating layer 11 in the form of a large area metal connection 8. The controllable channel is then formed by the semiconductor layer 6 in the region beneath the Schottky contact where the semiconducting layer bridges the insulating layer 3 between the source and the drain. The doping ratios and layer thicknesses correspond approximately to those of FIG. 1. A metallic drain contact 9 is applied to the drain region 14 and a source contact 10 is applied to the source region 13 on the rear face of the semiconductor body in a similar manner.

The structures in accordance with FIGS. 1 and 2 are particularly suitable for the manufacture of power transistors with several transistor structures of the type shown connected in parallel. All of the individual structures can be integrated in a semiconductor body which is common to all of the structures. In the embodiments, it is of course also possible to exchange the source and the drain and therefore to invert the mode of operation of the field effect transistors.

It will be understood that the above description of the present invention is susceptible to various modification changes and adaptations.

What is claimed is:

1. A vertical field effect transistor comprising: a semiconductor body; vertically displaced source and drain regions formed in said semiconductor body; an insulating layer disposed between and separating said source and drain regions; said source region, said drain region and said insulating layer all extend to a common edge surface; a thin conductive layer formed on said edge surface so that it bridges said insulating layer, and directly contacts the edge surface of said source and drain regions; a rectifying metal/semiconductor gate contact on said thin conductive semiconductor layer; a drain contact for said drain region; and a source contact for said source region.

2. A field effect transistor as defined in claim 1, wherein said thin conductive layer comprises a semiconductor layer produced epitaxially, by diffusion or by ion implantation.

3. A field effect transistor as defined in claim 1, wherein said insulating layer is produced by ion implantation so deeply beneath the semiconductor surface that a semiconductor region which forms said source or said drain region remains at the surface of said semiconductor body.

4. A field effect transistor as defined in claim 1, wherein said insulating layer is a thin layer arranged in said semiconductor body between a thin, conducting surface region, which is of a predetermined type of conductivity and forms said source region, and the substrate, which is of the same type of conductivity and forms said drain region, a V-shaped depression is formed in one major surface of said semiconductor body and penetrates said surface region and said insulating layer and extends into said substrate, whereby one side of said groove forms said common edge surface; said thin conductive layer is a semiconductor layer arranged in said depression; and said gate contact is a Schottky contact applied to said thin conductive layer within said depression.

5. A field effect transistor as defined in claim 1 wherein: a mesa-type semiconductor elevation is arranged on a major surface of a semiconductor substrate, which forms said source region, to provide said semiconductor body; said insulating layer is a thin layer arranged within said mesa elevation beneath a surface region which is disposed at the top of said mesa elevation and forms said drain region; said thin conductive layer is located on the side surface of said mesa elevation and connects said source region to said drain region whereby said side surface forms said common edge surface; and said gate contact is a Schottky contact applied to said thin conductive layer bridging said insulating layer on said side surface of said mesa elevation.

6. A field effect transistor as defined in claim 1, wherein said conductive layer is approximately 0.1 $\mu$m thick for the purpose of forming a self-blocking transistor and has an impurity concentration of approximately $10^{16}$ atoms/cm$^3$.

7. A field effect transistor as defined in claim 1, wherein said conductive layer is approximately 0.2 $\mu$m thick for the purpose of forming a self-conducting transistor and has an impurity concentration of approximately $10^{17}$ atoms/cm$^3$.

8. A field effect transistor as defined in claim 1, wherein said insulating layer is arranged approximately 0.3 to 0.5 $\mu$m beneath the semiconductor surface.

9. A field effect transistor according to claim 1, wherein said insulating layer is approximately 0.1 to 0.3 $\mu$m thick.

10. A field effect transistor as defined in claim 1, wherein said gate electrode extends onto a relatively thick insulating layer arranged on a major surface of said semiconductor body.

11. A vertical field effect transistor as defined in claim 1 wherein said source and drain regions and said insulating layer are all planar.

12. A vertical field effect transistor as defined in claim 1 wherein said source region, said drain region and said thin conductive region are all semiconductor regions of the same conductivity type.

13. A field effect transistor as defined in claim 4 wherein said source region, said drain region and said thin conductive layer are all of the same conductivity type.

* * * * *